(12) United States Patent
King (10) Patent No.: US 7,262,641 B2
(45) Date of Patent: Aug. 28, 2007

(54) CURRENT DIFFERENTIAL BUFFER

(75) Inventor: Gregory King, Hasting, MN (US)

(73) Assignee: Micron Technology, Inc., Boise, ID (US)

( * ) Notice: Subject to any disclaimer, the term of this patent is extended or adjusted under 35 U.S.C. 154(b) by 94 days.

(21) Appl. No.: 11/006,364

(22) Filed: Dec. 7, 2004

(65) Prior Publication Data

US 2006/0119403 A1 Jun. 8, 2006

(51) Int. Cl.
  *H03B 1/10* (2006.01)
  *H03K 3/00* (2006.01)
(52) U.S. Cl. .................... 327/108; 327/562; 327/563
(58) Field of Classification Search .............. 327/108, 327/560–563; 330/252–253
  See application file for complete search history.

(56) References Cited

U.S. PATENT DOCUMENTS

| | | | |
|---|---|---|---|
| 5,673,208 A | 9/1997 | Meier et al. ................ 364/525 |
| 5,884,242 A | 3/1999 | Meier et al. ................ 702/179 |
| 6,577,170 B1 * | 6/2003 | Prodanov .................... 327/103 |
| 6,825,692 B1 * | 11/2004 | Chung et al. ................. 326/68 |
| 6,944,079 B2 * | 9/2005 | Howe .......................... 365/207 |
| 2003/0181181 A1 * | 9/2003 | Darabi ..................... 455/250.1 |
| 2005/0248396 A1 * | 11/2005 | Caresosa et al. ............ 327/563 |

* cited by examiner

*Primary Examiner*—Quan Tra
(74) *Attorney, Agent, or Firm*—Fletcher Yoder (57) ABSTRACT

The present technique relates to a method and apparatus for operating a differential buffer. In the differential buffer, a first stage may include a differential pair configured to receive input signals and generate output signals. The first stage may also include adjustment circuitry coupled to the differential pair and configured to adjust an amount of current dissipated by the differential buffer. Further, a second stage may include current pulse circuitry coupled to the differential pair and the adjustment circuitry, wherein the current pulse circuitry is configured to generate a current pulse that is coincident with the switching of the differential pair. Finally, the second stage may also include grounding circuitry coupled to the current pulse circuitry and the differential pair, wherein the grounding circuitry is configured to receive the current pulse to prevent the output signals from switching during a transition of the output signals. As such, the differential buffer provides low or no static current dissipation with improved signal integrity for high-speed operation.

15 Claims, 6 Drawing Sheets

CURRENT DIFFERENTIAL BUFFER

BACKGROUND OF THE INVENTION

1. Field of the Invention

The present invention relates generally to semiconductor devices and, more particularly, to a differential buffering technique for use in a device, such as a memory device or application specific integrated circuit.

2. Description of the Related Art

This section is intended to introduce the reader to various aspects of art, which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, telephones, control systems, networks, and a host of consumer products. Microprocessors are essentially generic devices that perform specific functions under the control of a software program. This program is stored in a memory device, such as a dynamic random access memory (DRAM), static random access memory (SRAM) or other suitable type of memory that may be coupled to the microprocessor. Not only does the microprocessor access the memory devices to retrieve program instructions, but it also stores and retrieves data created during the execution of the program in one or more memory devices.

To enhance communication between components, such as the microprocessor and memory devices, various structures and circuitry may be utilized. For instance, these structures may enable the exchange of data signals between semiconductor chips and other devices. One structure that may be utilized is a buffer, which may store, delay and regenerate data signals. These buffers may be implemented in a variety of devices, such as DRAMs, SRAMs, memory buses, processors, network processors, application specific integrated circuits (ASICs), and intra-chip buses. As such, the buffers may be utilized to enhance the operation of the device.

Typical buffers may operate at speeds that are too slow for high-speed communication. As a result, differential buffers, along with a current mirror generated source, may be utilized as buffers. The differential buffers utilize a data signal and its compliment to provide faster sensing of changes in the data signal. This approach provides for faster data sensing because the data signals are complimentary signals. However, the differential buffers, which may be loaded with resistors or FETs, dissipate current at a static level, which consumes power unnecessarily. That is, the static level of current dissipation is not adjustable to allow the device to conserve power. Thus, differential buffers that provide a static level of current dissipation may be problematic.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

Embodiments of the invention provide a differential buffer that may provide low or no static current dissipation with enhanced signal integrity for differential buffering. A method and apparatus for operating a differential buffer that adjusts or eliminates current dissipation is provided. More particularly, in an explempary embodiment, a differential buffer may include a first stage, which includes a diode biased differential pair coupled to adjustment circuitry to control the supply bounce created during a transition of the output signals. The adjustment circuitry may be utilized to adjust the output swing level and adjust the current dissipation for the differential buffer. Further, in a second stage, current pulse circuitry may be utilized with the adjustment circuitry to provide a current pulse that is coincident with the switching of the output signals in the differential pair. This current pulse is mirrored to a bias device to control the voltage differential for the differential pair, which adjusts the current generated in the output signals.

BRIEF DESCRIPTION OF THE DRAWINGS

The foregoing and other advantages of the present technique may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present technique is an improved approach for utilizing a differential buffer that adjusts or eliminates the current dissipation in a differential buffer. In accordance with the present technique, a first stage, which includes a diode biased differential pair coupled to adjustment circuitry, controls the supply bounce created during a transition of the output signals. The adjustment circuitry is utilized to adjust the output swing level and to adjust the current dissipation for the differential buffer. Further, a second stage, which includes current pulse circuitry, is utilized with the adjustment circuitry to provide a current pulse that is coincident with the switching of the output signals on the differential pair. This current pulse is mirrored to a bias device to control the voltage level of a drain of a dissipation transistor. As a result, the operation of the device may be enhanced because the differential buffer supports high drive capability and enhances signal integrity for high-speed circuit operation.

Figure 1:
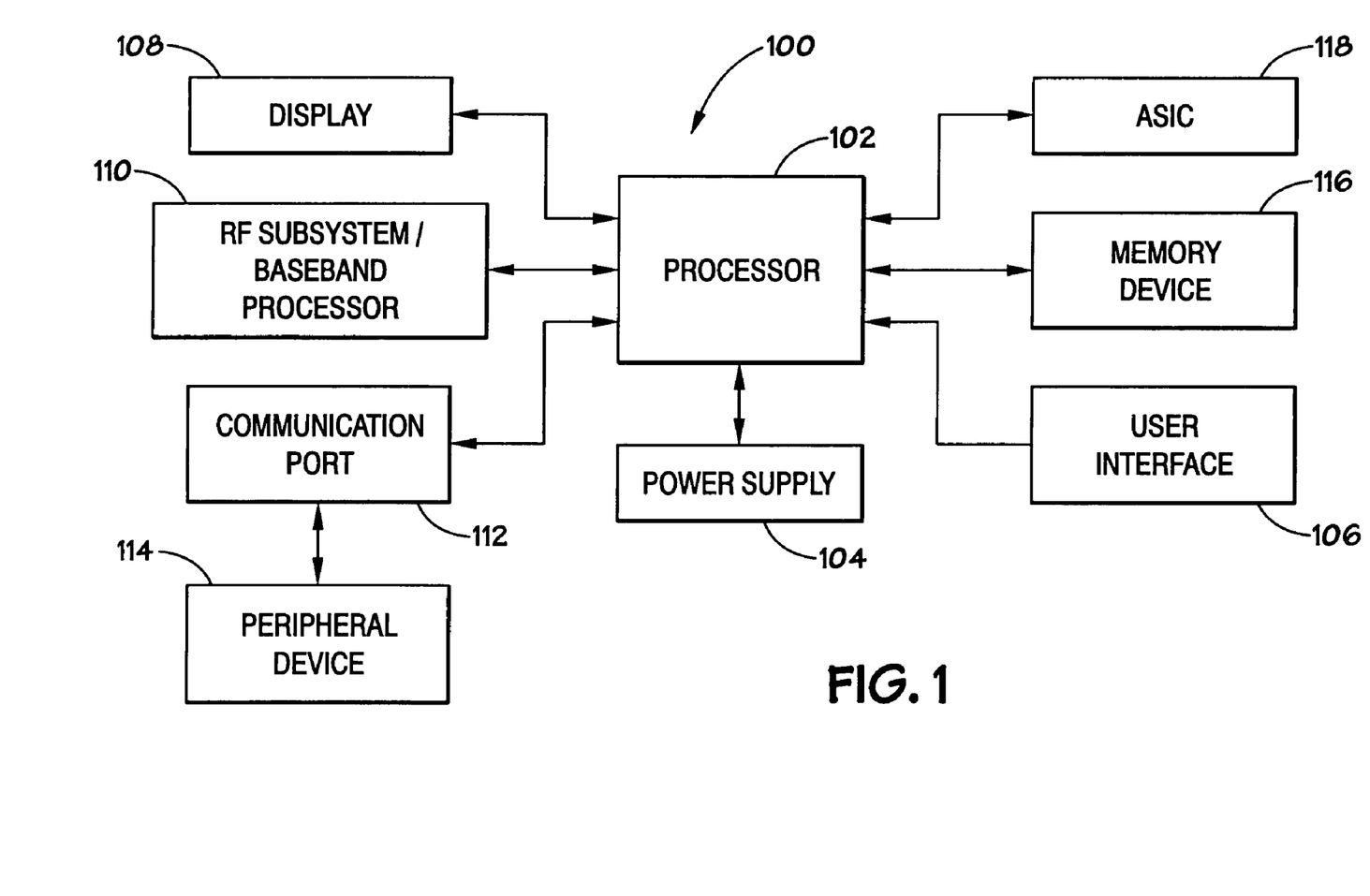
FIG. 1 illustrates a block diagram of an exemplary processor-based device in accordance with aspects of the present technique.

Turning now to the drawings, and referring initially to FIG. 1, a block diagram depicting an exemplary processor-based device, generally designated by the reference numeral 100, is illustrated. The device 100 may be any of a variety of different types, such as a computer, pager, cellular telephone, personal organizer, control circuit, etc. In a typical processor-based device, a processor 102, such as a microprocessor, controls many of the functions of the device 100.

The device 100 typically includes a power supply 104. For instance, if the device 100 is portable, the power supply 104 may include permanent batteries, replaceable batteries, and/or rechargeable batteries. The power supply 104 may also include an A/C adapter, so that the device may be plugged into a wall outlet, for instance. The power supply 104 may also include a D/C adapter, so that the device 100 may be plugged into a vehicle's cigarette lighter, for instance.

Various other devices may be coupled to the processor 102 to provide mechanisms for interacting with a user. For instance, a user interface 106 may be coupled to the processor 102 to allow a user to enter data into the device 100. The user interface 106 may include buttons, switches, a keyboard, a light pen, a mouse, and/or a voice recognition system, for instance. A display 108 may also be coupled to the processor 102 to present the user with information. The display 108 may include a liquid-crystal display (LCD), a cathode ray tube (CRT), light-emitting diodes (LEDs), and/or an audio display.

Furthermore, other devices may be coupled to the processor 102, which may depend upon the functions that the device 100 performs. For example, a radio frequency (RF) subsystem/baseband processor 110 may also be coupled to the processor 102 to communicate with other devices through a wireless link. The RF subsystem/baseband processor 110 may include an antenna that is coupled to an RF receiver and to an RF transmitter (not shown). Also, a communication port 112 may be coupled to the processor 102 for addition communication with other devices through a physical link. The communication port 112 may be adapted to be coupled to a peripheral device 114, such as a modem, a printer, or a computer, for instance. Further, depending on the particular device 100, an application specific integrated circuit (ASIC) 118 may be utilized in the processor-based device to perform specific functions, such as those associated with a cellular telephone, medical instrument, automobile safety system, and/or high-performance security camera, for example.

Because the processor 102 controls the functioning of the device 100, which is generally under the control of software programming, memory is coupled to the processor 102 to store and facilitate execution of the program. For instance, the processor 102 may be coupled to a memory device 116, which may include volatile memory, such as dynamic random access memory (DRAM) and/or static random access memory (SRAM), for instance. The amount of DRAM and SRAM may depend on the specific design of the device 100. The memory device 116 may also include non-volatile memory, such as read only memory (ROM)or erasable programmable ROM (EPROM), that is utilized in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory may include a high capacity memory, such as a disk or tape drive memory. As will be apppeciated the memory device 116 may actually include any number of desirable types of memory devices.

The processor-based device 100 may include numerous semiconductor chips in the various components that are utilized to provide the functionality to the device 100. For instance, the memory device 116 may be one or more semiconductor chips that are coupled to the processor-based device 100 to store the software programming for the operation of the processor-based device 100. The semiconductor chips may exchange signals between each other and other components of the device 100 to perform their respective functions. As such, improvements in each of the semiconductor chips may improve the efficiency of the processor-based device 100 and provide reliable access to the information stored in the memory device 116. An exemplary embodiment of a memory device, such as the volatile memory, is explained in greater detail in FIG. 2.

Figure 2:
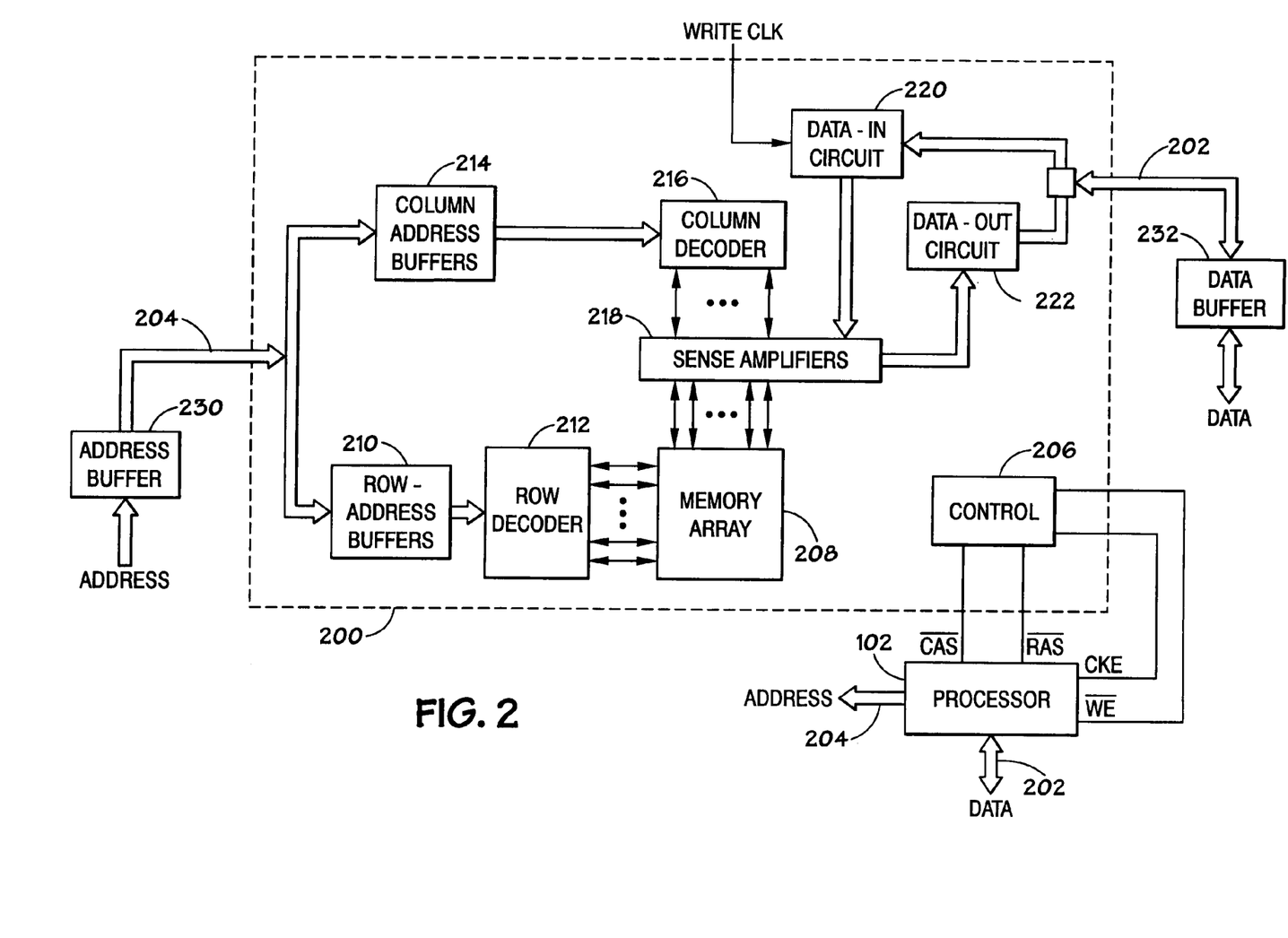
FIG. 2 illustrates a block diagram of an exemplary memory device in the processor-based device of FIG. 1 in accordance with aspects of the present technique.

Turning now to FIG. 2, a block diagram depicting an exemplary embodiment of a memory device is illustrated. The description of the memory device 116 has been simplified for illustrative purposes and is not intended to be a complete description of each feature in a memory device 116. Differential buffers in accordance with aspects of the present techniques, which are described in more detail with reference to FIG. 4, may be utilized in row-address buffers 210, column address buffers 214, data-in circuitry 220, data-out-circuitry 222, address buffers 230, and/or data buffers 232, as discussed below. Similarly, the present technique may not be limited to implementation in a memory device 116 but may be applicable to other devices, such as memory buses, processors, network processors, and intra-chip buses, which may benefit from high drive capability and enhanced signal integrity for high speed circuit operation. As such, various devices may implement the differential buffers in accordance with aspects of the present technique.

During operation, the memory device 116 may receive various inputs that are utilized by various circuits within the memory device 116. For instance, individual inputs, such as control information, address information, and data, may be provided over a memory bus to the memory device 116. These individual representations of inputs are illustrated by a data bus or lines 202, address bus or lines 204, and various discrete lines directed to control logic 206. The memory device 116 includes a memory array 208, which comprises rows and columns of addressable memory cells. To provide access to the memory cells, each memory cell in a row is coupled to a word line. Additionally, each memory cell in a column is coupled to a bit line. The word line and bit line may be utilized to access, a storage capacitor through an access transistor in each cell of the memory array 208, for instance.

The memory device 116 interfaces with, for example, a processor 102, such as a microprocessor, through address lines 204 and data lines 202. Alternatively, the memory device 116 may interface with other devices, such as a memory controller, a microcontroller, a chip set, or another electronic system. The processor 102 may also provide a number of control signals to the memory device 116. Such control signals may include row and column address strobe signals RAS and CAS, a write enable signal WE, a clock enable signal CKE, and other conventional control signals. The control logic 206 controls many available functions of the memory device 116. In addition, various other control circuits and signals, not detailed herein, contribute to the operation of the memory device 116.

Row-address buffers 210 and a row decoder 212 receive and decode row addresses from row address signals provided on the address lines 204 via the address buffers 230. Each unique row address corresponds to a row of cells in the memory array 208. The row decoder 212 typically includes a word line driver, an address decoder tree, and circuitry, which translates a given row address received from the row-address buffers 210 and selectively activates the appropriate word line of the memory array 208 via the word line drivers.

A column address buffer 214 and a column decoder 216 receive and decode column address signals provided on the address lines 204. The column decoder 216 may also determine when a column is defective, as well as the address of a replacement column. The column decoder 216 is coupled to sense amplifiers 218. The sense amplifiers 218 are coupled to complimentary pairs of bit lines of the memory array 208, for example.

The sense amplifiers 218 are coupled to data-in (i.e., write) circuitry 220 and data-out (i.e., read) circuitry 222. The data-in circuitry 220 and the data-out circuitry 222 include data drivers and latches. During a write operation, the data lines 202 provide data from the address buffers 230 to the data-in circuitry 220. The sense amplifier 218 receives data from the data-in circuitry 220 and stores the data in the memory array 208 as a charge on a capacitor of a cell at an address specified on the address lines 204.

During a read operation, the memory device 116 transfers data to the processor 102 from the memory array 208. Complimentary bit lines for the accessed cell are equilibrated during a precharge operation to a reference voltage provided by an equilibration circuit and a reference voltage supply. The charge stored in the accessed cell is then shared with the associated bit lines. The sense amplifier 218 detects and amplifies a difference in voltage between the complimentary bit lines. Address information received on address lines 204 facilitates selection of a subset of the bit lines and coupling of them to complimentary pairs of input/output (I/O) wires or lines. The I/O wires pass the amplified voltage signals to the data-out circuitry 222 and eventually to the data bus 202. The data-out circuitry 222 may include a data driver (not shown) to drive data out onto the data bus 202 in response to a read request directed to the memory array 208. Further, the data-out circuitry 222 may include a data latch (not shown) to latch the read data until the data driver drives it onto the data bus 202.

In exchanging data, the column-address buffers 214, the row-address buffers 210, the data-in circuitry 220, the data-out-circuitry 222, address buffers 230, and data buffers 232 may utilize buffers to delay, regenerate and store data signals communicated between the various components. These buffers may include various types of buffers. However, as discussed above, problems with signal integrity may result from noise that alters the signal in some types of buffers. Further, some types of buffers may operate slower, which would be disadvantageous for high-speed operation.

Accordingly, one buffering technique that may be utilized is a differential buffer. In a differential buffer, a data signal and its compliment are utilized to provide faster sensing of changes in the data signal. This approach provides for faster data sensing because the data signals are complimentary signals. Accordingly, a differential buffer with a current mirror generated current source may be utilized. However, in this design, the current mirror generated current source may limit the current produced from the output terminals of the differential buffer. However, it may have problems with power consumption because the current mirror generated current source may provide a static level of current dissipation and may be loaded with either FET or resistor devices. As can be appreciated, it may be advantageous to reduce or eliminate the static current dissipation.

To provide higher performance data buffering, a differential buffer or device may include additional circuitry to reduce the power consumption and maintain signal integrity for high-speed operations. For instance, the differential buffer may include a diode biased differential pair with adjustment circuitry, such as adjustment transistors, to provide current dissipation adjustability. In addition, the differential buffer may include a current mode common mode control circuit. The current mode common mode control circuit may include current pulse circuitry, such as pulse transistors, that provide a current pulse that is coincident with the switching of the output signals of the differential pair and grounding circuitry, such as grounding transistors, that times the switching of a current pulse to match the transition of the output signals from the differential pair. The differential buffer, which may be implemented in column-address buffers 214, row-address buffers 210, data-in circuit 220, data-out-circuit 222, address buffers 230 and/or data buffers 232, is described in greater detail with reference to FIG. 4.

Figure 3:
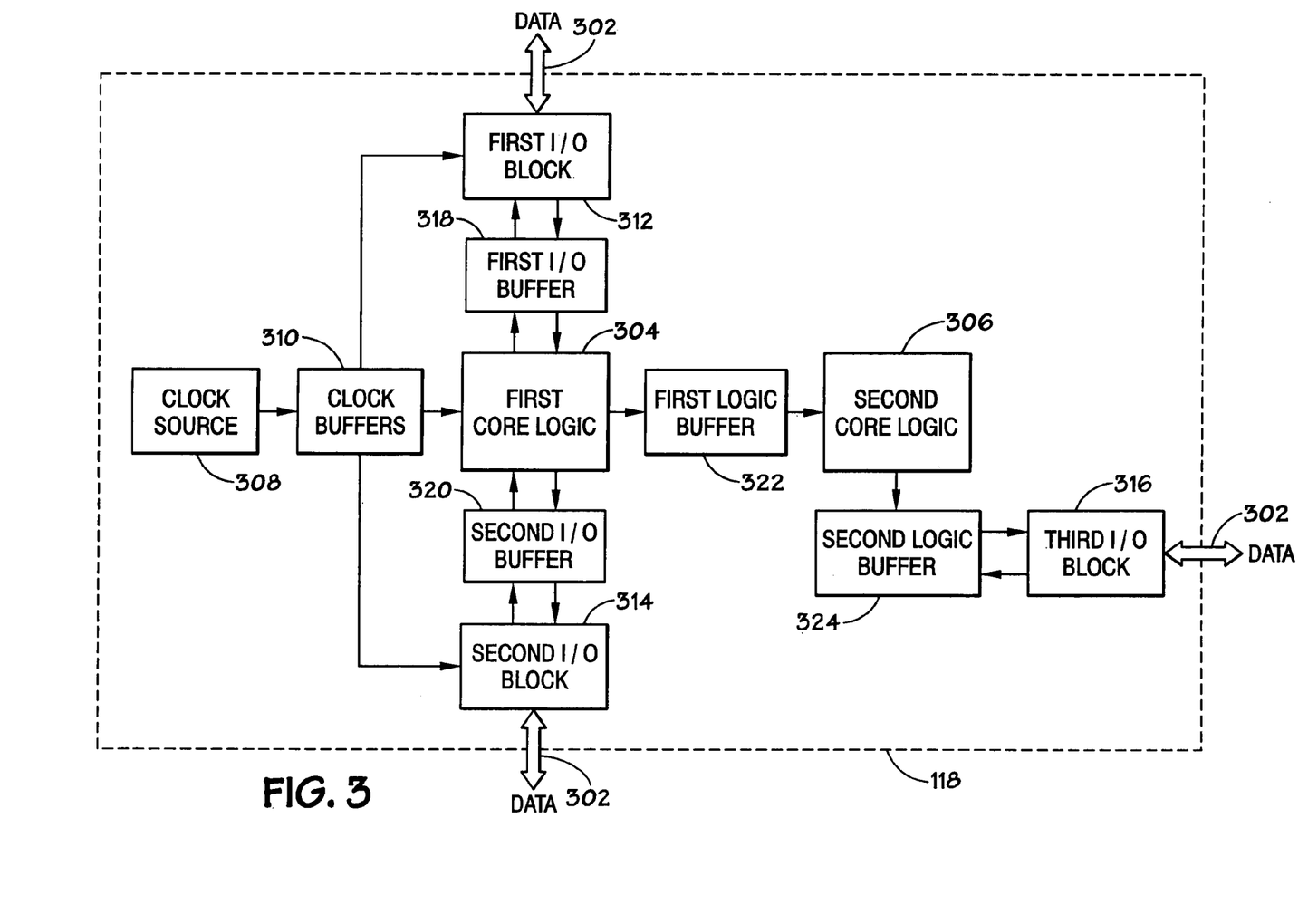
FIG. 3 illustrates a block diagram of an exemplary application specific integrated circuit in the processor-based device of FIG. 1 in accordance with aspects of the present technique.

As previously discussed, the improved differential buffer may also be implemented in the ASIC 118. FIG. 3 shows an exemplary application specific integrated circuit (ASIC) in the processor-based device of FIG. 1 that may utilize embodiments of the differential buffer. The description of the ASIC 118 has been simplified for illustrative purposes and is not intended to be a complete description of each feature in the ASIC 118. Differential buffers in accordance with the present technique, which are described in FIG. 4, may be utilized in clock buffer 310, a first input/output (I/O) buffer 318, a second I/O buffer 320, a first logic buffer 322, and/or a second logic buffer 324, as discussed below. As such, various devices may implement the differential buffers in accordance with aspects of the present technique to hold or delay data signals and to regenerate data signals for high-speed operations.

The ASIC 118 may include a first core logic 304 and second core logic 306, which are utilized to perform specific tasks. For instance, the first and second core logic 304 and 306 may be utilized as complementary metal-oxide semiconductor (CMOS) image sensors to provide high-resolution video capabilities. These CMOS image sensors may be utilized in cellular telephones, medical procedures, automobiles safety systems, and/or high-performance security cameras. Further, the first core logic 304 may be a command decoder/scheduler block and the second core logic 306 may be a memory controller block. As a command decoder/scheduler block, the first core logic 304 may interpret and schedule externally received commands, which are then formatted to be executed by the second core logic 306. The second core logic 306 would issue commands to an I/O blocks to transmit and/or receive data signals. Alternatively, first core logic 304 may also be a processor or a microcontroller that issues commands/requests to the second core logic 306, which may be a chip-to-chip interface control block. The second core logic 306 may utilize PCI, PCI Express, or hypertransport to communicate with the appropriate I/O block.

Various inputs and signals may be utilized by the core logic 304 and 306 to perform specific functions and communicate with other devices and circuitry. For instance, a clock source 308 may be utilized to provide clock signals to the first core logic 304 and various other components within the ASIC 118. The clock signals may be provided to clock buffers 310 to synchronize the clock signals throughout the ASIC 118. Also, individual inputs, such as control information and data, may be provided via a data bus or lines 302 to the ASIC 118 from other devices, such as the processor 102 and the memory device 116 of FIG. 1. To interact with other devices, a first I/O block 312, a second I/O block 314 and a third I/O block 316 may be utilized as an interface between external devices and the first core logic 304 and/or the second core logic 306. Alternatively, the ASIC 118 may interface with other devices, such as a memory controller, a microcontroller, or another electronic system.

During operation, signals exchanged between the components of the ASIC 118 may utilize different buffers to temporarily hold or regenerate data signals. These buffers may include the clock buffers 310, a first input/output buffer 318, a second I/O buffer 320, a first logic buffer 322, and/or a second logic buffer 324, which may include differential buffers. As an example, the I/O blocks 312 and 314, along with the first core logic 304, may receive clock signals from the clock buffer 310 to synchronize the exchange of data signals. Similarly, the I/O blocks 312 and 314, along with the second core logic 306, may utilize the buffers 318, 320 and 322, respectively, to communicate with the first core logic 304. Finally, the second core logic 306 may utilize the second logic buffer 324 to communicate with the third I/O block 316. Each of these buffers 310, 318, 320, 322 and 324 may be utilized to synchronize and regenerate data signals that are exchanged between the various logic devices internal to the ASIC 118.

As discussed above, typical buffers may have problems with signal integrity that results from noise on the signals, which may alter the signal, and with excessive power consumption. As can be appreciated, a differential buffer may include a diode biased differential pair with adjustment circuitry and a current mode common mode control circuit that has current pulse circuitry and grounding circuitry to reduce the power consumption and maintain signal integrity for high-speed operations. These differential buffers, which may be implemented in clock buffers 310, a first input/output buffer 318, a second I/O buffer 320, a first logic buffer 322, and/or a second logic buffer 324, are described in greater detail in FIG. 4.

Beneficially, the present differential buffers utilize a differential signaling technology to support high-speed operations. Unlike other differential buffers that provide a static level of dissipation, the present embodiment of a differential buffer reduces or even eliminates the static current dissipation found in traditional differential buffers. In the exemplary embodiment shown in FIG. 4, a negative-channel metal-oxide semiconductor (NMOS) differential pair with a positive-channel metal-oxide semiconductor (PMOS) load is illustrated. However, this differential buffer may alternatively be constructed with PMOS devices to address a low voltage potential instead of a high voltage potential. An exemplary embodiment of a differential buffer is explained in greater detail below with reference to FIG. 4.

Figure 4:
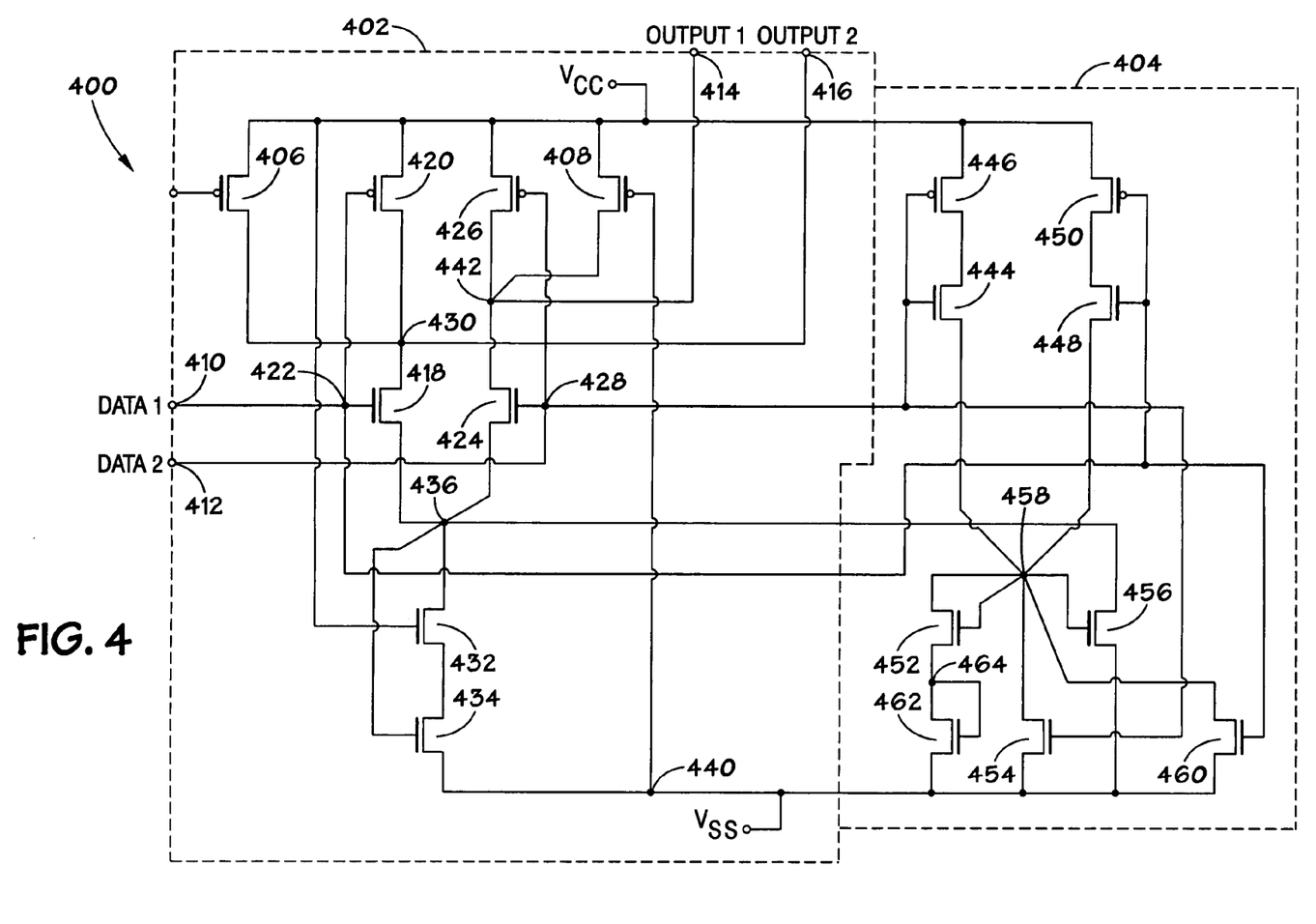
FIG. 4 illustrates a block diagram of an exemplary embodiment of a differential buffer used in the memory device of FIG. 2 or application specific integrated circuit in FIG. 3 in accordance with aspects of the present technique.

FIG. 4 illustrates a schematic diagram of an exemplary embodiment of a differential buffer used in the memory device of FIG. 2 and the ASIC of FIG. 3 in accordance with aspects of the present technique. The differential buffer 400 may be divided into a first stage 402 that provides current adjustability for the differential buffer 400 and a second stage 404 that sets the output swing of the differential buffer 400. Beneficially, by utilizing these two stages 402 and 404, the differential buffer 400 provides low or no static current dissipation with the enhanced benefits of improved signal integrity related to using differential signaling for high-speed circuit operation. Accordingly, the differential buffer 400 may be utilized in the memory device 116 and the ASIC 118 of FIGS. 2-3.

The first stage 402 of the differential buffer 400 may include a diode biased differential pair, such as a first transistor 418 and a second transistor 424, along with adjustment circuitry, such as a first adjustment transistor 406 and a second adjustment transistor 408, to provide the static current adjustability for the differential buffer 400. The first and second adjustment transistors 406 and 408 provide the ability to adjust the output swing level and adjust the amount of static current dissipation for the differential buffer 400. Also, the first and second adjustment transistors 406 and 408 may be turned "off" or eliminated to have zero static current draw. Accordingly, the first and second adjustment transistors 406 and 408 provide a designer with some control over how much supply bounce is created during a transition of the output buffer from low to high or high to low with a corresponding increase in the amount of static current dissipation. In addition, the first stage 402 may include a bias device or circuitry, such as the first dissipation transistor 432 and the second dissipation transistor 434. These dissipation transistors 432 and 434 may be utilized to adjust the voltage level at the drain of the differential pair. As such, the first stage 402 may reduce the current dissipated from the differential buffer 400.

To operate, the first stage 402 of the differential buffer 400 may be coupled to input signals, such as the data signal DATA1 and the complimentary data signal DATA2. The first stage 402 may provide an output signal OUTPUT1 and a complimentary output signal OUTPUT2. The input signals are delivered to the input terminals of the first stage 402, which include a first input terminal 410 and a second input terminal 412. The first stage 402 may utilize the input signals, such as data signals DATA 1 and DATA2, which are received at the input terminals 410 and 412 to produce output signals OUTPUT1 and OUTPUT2 at a first output terminal 414 and a second output terminal 416.

To provide the output signals, the first and second input terminals 410 and 412 are coupled to various transistors in the first stage 402. For instance, the first input terminal 410 is connected to a gate of a first transistor 418 and a gate of a second transistor 420 via a node 422, while the second input terminal 506 is connected to a gate of a third transistor 424 and a gate of a fourth transistor 426 via a node 428. The first transistor 418 may be coupled in series between the second transistor 420, the first adjustment transistor 406, and output terminal 416 connected at a node 430 and a first dissipation transistor 432, a gate of a second dissipation transistor 434 and the third transistor 424 at a node 436. The second transistor 420 and the first adjustment transistor 406, which are coupled in parallel, are coupled in series between a first voltage source $V_{cc}$ and the node 430. Further, the first dissipation transistor 432 and the second dissipation transistor 434 are coupled in series between the node 436 and the second voltage source $V_{ss}$ along with gates to the first and second adjustment transistors 406 and 408 at a node 440. The second voltage source $V_{ss}$ may be ground or a voltage source of lower potential than the first voltage source $V_{cc}$. The third transistor 424 may be coupled in series between the fourth transistor 426, the second adjustment transistor 408, and the second output terminal 414 via a node 442 and the first dissipation transistor 432 via the node 436. The fourth transistor 426 and the second adjustment transistor 408, which are coupled in parallel, are coupled in series between the first voltage source $V_{cc}$ and the node 442.

In an exemplary embodiment of the first stage 402, the various transistors may be PMOS and NMOS transistors. For instance, the first transistor 418, the third transistor 424, the first dissipation transistor 432 and the second dissipation transistor 434 may be NMOS transistors, while the second transistor 420, fourth transistor 426, first adjustment transistor 406, and second adjustment transistor 408 may be PMOS transistors.

From the first stage 402, three general types of signals may be produced. First, if the voltage applied to the first input terminal 410 is "high" and the voltage applied to the second input terminal 412 is "low," then the signal on the first output terminal 414 is "high" and the signal at the second output terminal 416 is "low", because more current flows across the fourth transistor 426. Secondly, if the voltage applied to the first input terminal 410 is "low" and the voltage applied to the second input terminal 412 is "high," then the signal on the first output terminal 414 is "low", and the signal on the second output terminal 416 is "high", because more current flows across the second transistor 420. Finally, if the voltages applied to the first input terminal 410 and to the second input terminal 412 are both "low" or both "high," then the signals on the first output terminal 414 and the second output terminal 416 are "indeterminate," because the current flow across the second transistor 420 and the fourth transistor 426 is approximately equal. In this final situation, the signal at the output terminals 414 and 416 is neither "low" nor "high," but is "indeterminate" because it is between the two levels. Accordingly, the second stage 402 may be utilized to bias the current produced from the output terminals 414 and 416, as discussed further below.

The second stage 404 of the differential buffer 400 may be a current controlled common mode voltage control circuit. The second stage 404 may be utilized with the first and second adjustment transistors 406 and 408 to set the output swing of the differential buffer 400. The second stage 404 of the differential buffer 400 may be coupled to the node 422, node 428, node 436, the first voltage source $V_{cc}$ and the second voltage source $V_{ss}$ of the first stage 402 to operate. In this second stage 404, current pulse circuitry, which may include a first pulse transistor 444, a second pulse transistor 446, a third pulse transistor 448, and a fourth pulse transistor 450, may be utilized to provide a current pulse, which is coincident with the switching of the output signals in the differential pair. Further, grounding circuitry, such as a first grounding transistor 452, a second grounding transistor 454, a third grounding transistor 456, a fourth grounding transistor 460, and a fifth grounding transistor 462, may be utilized to prevent the current from the differential pair from forcing the output signals to shift during a transition. This current pulse is mirrored to a bias device, such as first dissipation transistor 432, to control the voltage level at the drain of the first dissipation transistor 432. That is, the second stage 404 times the switching of the current pulse to match the transition of the output signal of the differential pair (i.e., the first transistor 418 and third transistor 424). Beneficially, this type of circuitry supports high drive capabilities.

To operate the second stage 404, the node 422, node 428, node 436, first voltage source $V_{cc}$ and second voltage source $V_{ss}$ are coupled to various transistors in the second stage 404. For instance, a gate of the first pulse transistor 444, a gate of the second pulse transistor 446, and a gate of a second grounding transistor 454 may receive signals from the node 428, while a gate of the third pulse transistor 448, a gate of the fourth pulse transistor 450, and a gate of a fourth grounding transistor 460 may receive signals from the node 422. The first pulse transistor 444 may be coupled in series between the second pulse transistor 446 that is coupled to the first voltage source $V_{cc}$ and a gate and source/drain of a first grounding transistor 452, a second grounding transistor 454, a gate of a third grounding transistor 456, and a fourth grounding transistor 460 at a node 458. The third pulse transistor 448 may be coupled in series between the fourth pulse transistor 450 that is coupled to the first voltage source $V_{cc}$ and the transistors coupled to the node 458. Further, the first grounding transistor 452 is coupled in series with the fifth grounding transistor 462 that is coupled to the second voltage source $V_{ss}$. A gate for the fifth grounding transistor 462 is coupled between the first grounding transistor 452 and the fifth grounding transistor 462 at a node 464. Also, the second grounding transistor 454 and the fourth grounding transistor 460, which are coupled in parallel, are coupled in series between the node 458 and the second voltage source $V_{ss}$. Finally, the third grounding transistor 456 is coupled in series between the node 428 and the second voltage source $V_{ss}$.

Within the second stage 404, the various transistors may be PMOS and NMOS transistors. For instance, the first pulse transistor 444, third pulse transistor 448, first grounding transistor 452, second grounding transistor 454, third grounding transistor 456, fourth grounding transistor 460, and a fifth grounding transistor 462 may be NMOS transistors, while the second pulse transistor 446 and fourth pulse transistor 450 may be PMOS transistors. To operate the second stage 404, the data signals DATA1 and DATA2, which are complimentary signals, may be applied to the input terminals 410 and 412. Based on the data signals DATA1 and DATA2, the current drawn by the first transistor 418 and the third transistor 424 may spike during an output signal transition of output signals OUTPUT1 and OUTPUT2. Similarly, the second pulse transistor 446 may also have a current spike during the transition of output signals OUTPUT1 and OUTPUT2. This additional current is provided to the first grounding transistor 452, which results in a current pulse on the third grounding transistor 456. The current on the third grounding transistor 456 prevents the current on the first and third transistors 418 and 424 from forcing the output voltage to shift during a transition. The operation and interaction of the first and second stages 402 and 404 may be further understood with reference to the timing diagrams in FIGS. 5A-5E.

The FIGS. 5A-5E illustrate a group of graphs depicting current verses time for different transistors within the first and second stages 402 and 404 of the differential buffer 400. These graphs depict the current draws of different transistors based on the data signals DATA1 and DATA2 and resulting output signals OUTPUT1 and OUTPUT2 in the differential buffer 400. The different current draws occur at transition times, such as transition times TP1-TP10, when the output signals change from a "low" to "high" value or a "high" to "low" value. The "low" value may indicate a low current amount or voltage level, while the "high" value may represent a higher current value or voltage level. Accordingly, each of the graphs include the transition times TP1-TP10, which correspond to the transition period for the output signals. As such, FIGS. 5A-5E may further describe the operation of the transistors in the first stage 402 and the second stage 404 of the differential buffer 400, which may be best understood in conjunction with FIG. 4.

Figure 5A:
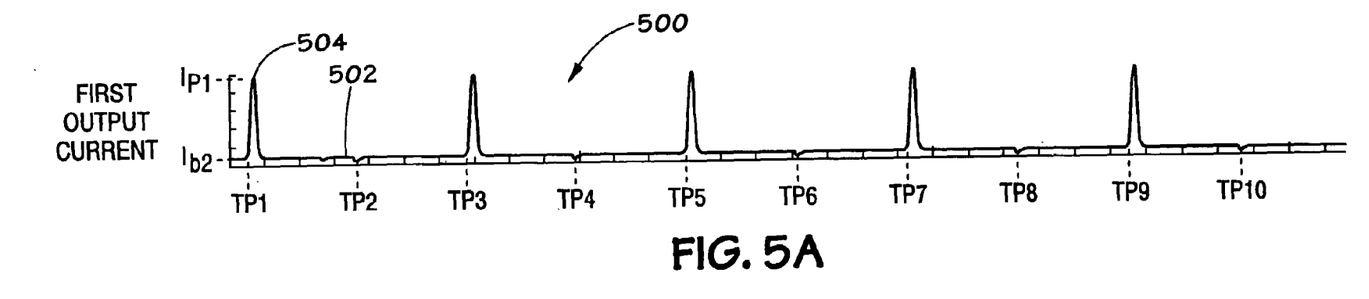
FIGS. 5A–5E illustrate timing diagrams depicting the operation of the exemplary embodiment of the differential buffer in FIG. 4 in accordance with aspects of the present technique.

In FIG. 5A, a graph, which is herein referred to by reference numeral 500 and labeled "First Output Current," corresponds to the current draw from the first voltage source $V_{cc}$ by the fourth transistor 426 at different periods of time. In this graph 500, a first output current 502 is shown at a base current level $I_{b1}$ with different current spikes to a spike current level $I_{P1}$. The current spikes, such as a current spike 504, occur during a transition of the output signal OUTPUT1 from a "low" value to a "high" value during the transition times TP1, TP3, TP5, TP7 and TP9. Particularly, the current spike 504 represents the current draw of the fourth transistor 426 during a transition of the output signal OUTPUT1 at the transition time TP1. The output signal OUTPUT1 transitions based on the changes in the data signal DATA1, which transitions between a "low" value and a "high" value.

Figure 5B:
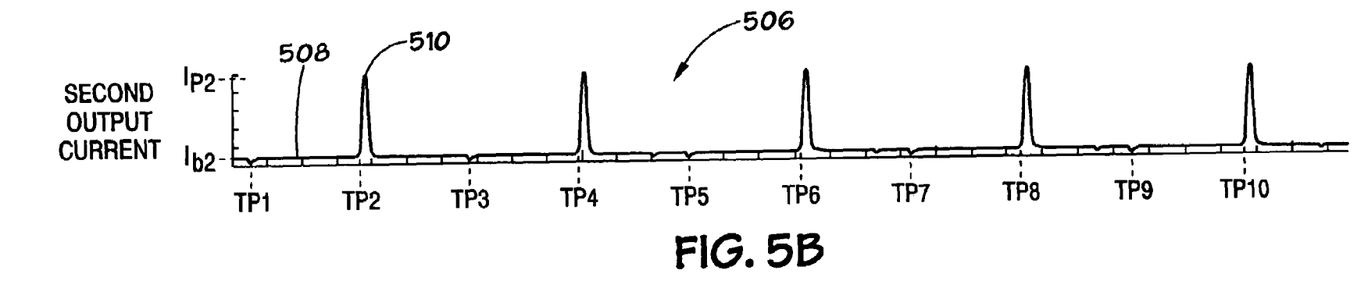

Similarly, in FIG. 5B, a graph, which is herein referred to by reference numeral 506 and labeled "Second Output Current," corresponds to the current draw from the first voltage source $V_{cc}$ by the second transistor 420 at different periods of time. In this graph 506, a second output current 508 is shown with a base current level $I_{b2}$ and current spike levels $I_{P2}$. The current spikes, such as a current spike 510, occur during a transition of the output signal OUTPUT2 from a "low" value to a "high" value during the transition times TP2, TP4, TP6, TP8 and TP10. Specifically, this current spike 510 represents the current draw of the second transistor 420 during a transition of the output signal OUTPUT2 at a second transition time TP2. The output signal OUTPUT2 transitions based on the changes in the data signal DATA2, which transitions between a "low" value and a "high" value.

Figure 5C:
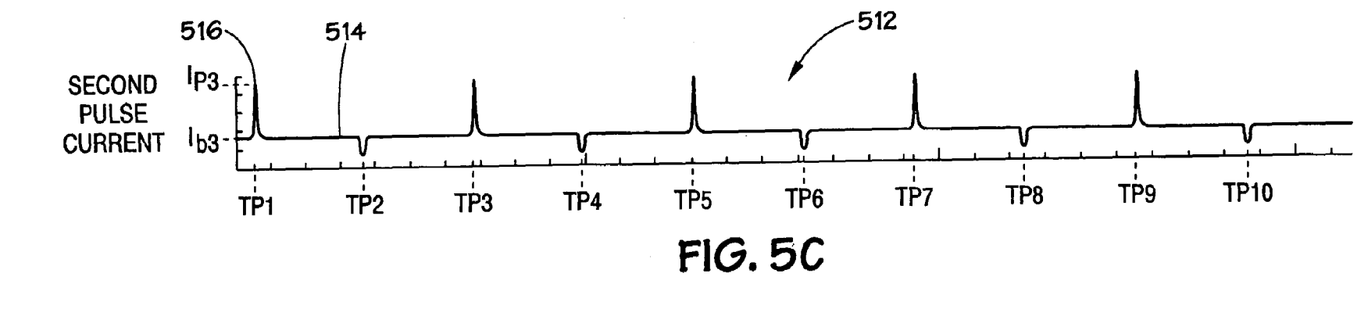

In FIG. 5C, a graph, which is herein referred to by reference numeral 512 and labeled "Second Pulse Current," corresponds to the current draw from the first voltage source $V_{cc}$ by the second pulse transistor 446 at different periods of time. In this graph 512, a second pulse current 514 is shown with a base current level $I_{b3}$ and different current spike levels $I_{P3}$. The current spikes, such as a current spike 516, occur during a transition of the output signal OUTPUT1 at the transition times TP1, TP3, TP5, TP7 and TP9. Specifically, the current spike 516 represents the current draw of the top of the common mode control mirror or current pulse circuitry, which is the second pulse transistor 446, during the transition time TP1. Accordingly, the second pulse current 514 has a current spike each time the fourth transistor 426 has a current spike, which is discussed above in FIG. 5A. As can be appreciated, the fourth pulse transistor 450 may have similar current spikes for transition times TP2, TP4, TP6, TP8 and TP10, which are associated with current spikes of the second transistor 420, as well. As such, the current pulse circuitry may provide the grounding circuitry with a current pulse for each of the transition times TP1-TP10.

Figure 5D:
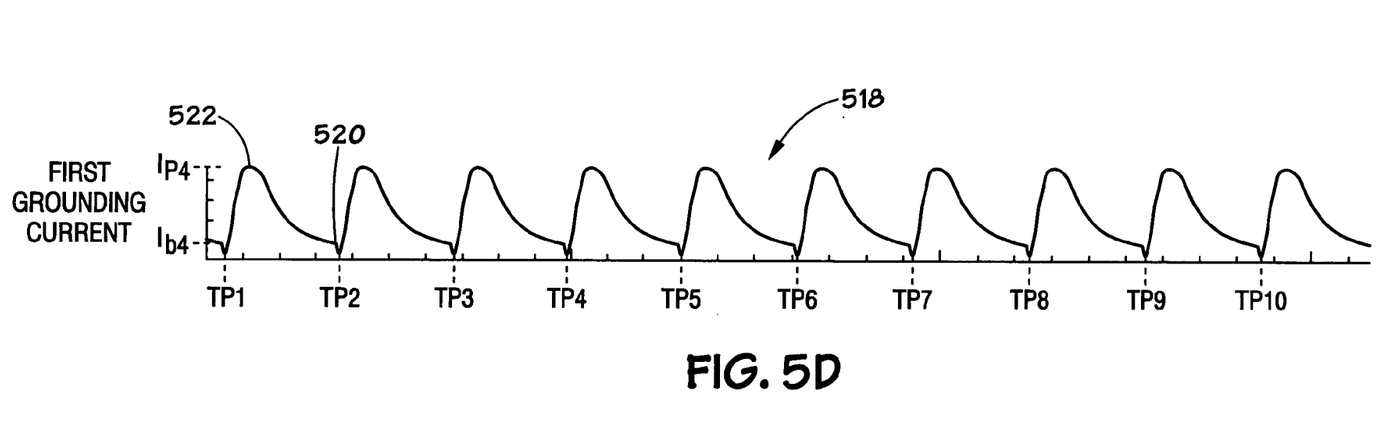

In FIG. 5D, a graph, which is herein referred to by reference numeral 518 and labeled "First Grounding Current," corresponds to the current received from the second pulse transistor 446 and the fourth pulse transistor 450 at different periods of time. In this graph 518, a first grounding current 520 is shown with a base current level $I_{b4}$ and current spike levels $I_{P4}$. The current spikes, such as a current spike 522, occur during a transition of either of the output signals OUTPUT1 and OUTPUT2 during each of the transition times TP1-TP10. Specifically, the current spike 516 represents the current provides to the first grounding transistor 452 from the second pulse transistor 446 during the transition time TP1. Accordingly, the first grounding current 520 has a current spike with every transition of the output signals, which is provided to the third grounding transistor 456, as discussed in FIG. 5E.

Figure 5E:
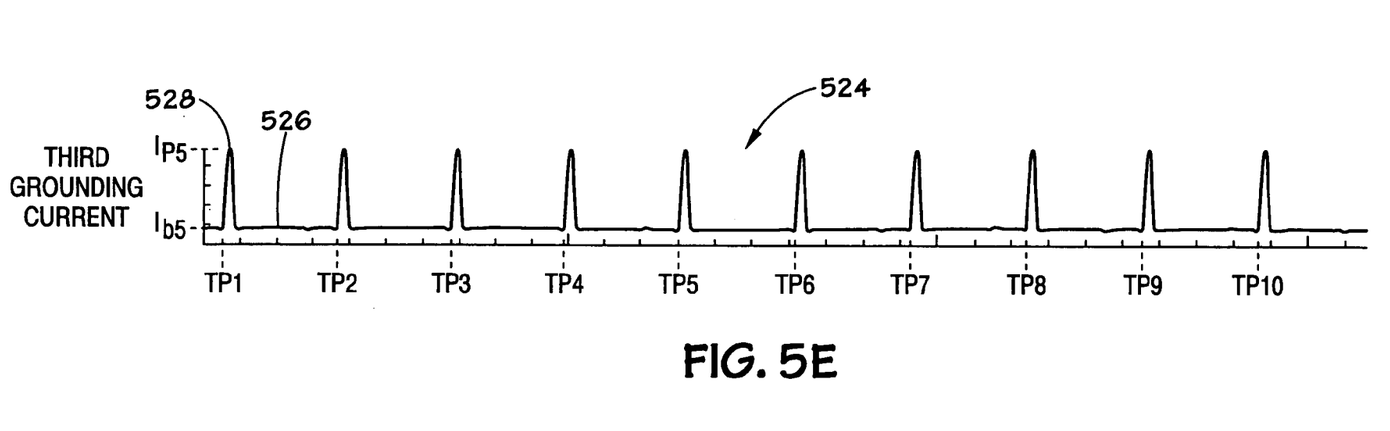

In FIG. 5E, a graph, which is herein referred to by reference numeral 524 and labeled "Third Grounding Current," corresponds to the current at the third grounding transistor 456 at different periods of time. In this graph 524, a third grounding current 526 is shown with a base current level $I_{b5}$ and different current spike levels $I_{P5}$. The current spikes, such as a current spike 528, occur during a transition of either of the output signals OUTPUT1 and OUTPUT2 during each of the transition times TP1-TP10, which is similar to the current spikes on the first grounding transistor 452. The current spikes are a result of the current provided to the first grounding transistor 452 and are utilized to prevent the current from the second and fourth transistors 420 and 426 from forcing the output signals to shift during the transition times TP1-TP10.

Beneficially, the second stage 404 may be utilized to prevent the current generated during transitions in the first stage 402 from causing output shifts. Specifically, by configuring the pulse circuitry, such as transistors 444, 446, 448, and 450, along with the grounding circuitry, such as transistors 452, 454, 456, 462 and 464, to generate a current during the transitions, the second stage 402 may be utilized to prevent the output voltages from shifting during transitions. As a result, the low or no static current dissipation may be utilized to conserve power and maintain signal integrity within the differential buffer.

In addition, the differential buffer 400 may be altered to provide some additional control over the adjustment circuitry. With reference to FIG. 4, the gates of the first adjustment transistor 406 and the second adjustment transistor 408 may receive control signals from other circuitry to control the adjustment circuitry. For example, the gates of the first adjustment transistor 406 and the second adjustment transistor 408 may be coupled to another input terminal in the differential buffer. This may allow circuitry outside of the differential buffer to adjust the adjustment transistors 406 and 408. Also, the gates of the first adjustment transistor 406 and the second adjustment transistor 408 may be coupled to other circuitry within the differential buffer that may provide controls signals to operate the adjustment transistors 406 and 408. Thus, the adjustment circuitry may be controlled by other circuitry to provide control over the differential buffer 400.

Further, it should be appreciated that the transistors in FIG. 4 may be biased by a voltage, such as the first voltage source $V_{cc}$ or the second voltage source $V_{ss}$. For instance, the adjustment transistors 406 and 408, second transistor 420, fourth transistor 426, second pulse transistor 446 and fourth pulse transistor 450 may be biased by the first voltage source $V_{cc}$. Also, the first transistor 418, second transistor 424, first dissipation transistors 432, second dissipation transistors 434, first pulse transistor 444, third pulse transistor 448, and the grounding transistors 452, 454, 456, 460 and 462 may be biased by the second voltage source $V_{ss}$.

Thus, each of the transistors may be biased to improve the performance of the differential buffer 400.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
a processor; and
a device coupled to the processor and having a differential buffer comprising:
a differential pair configured to receive a plurality of input signals and to generate a plurality of output signals;
adjustment circuitry coupled to the differential pair and configured to adjust an amount of current dissipated by the differential buffer;
current pulse circuitry coupled to the differential pair and the adjustment circuitry, wherein the current pulse circuitry is configured to generate a current pulse that is coincident with the switching of the differential pair;
grounding circuitry coupled to the current pulse circuitry and the differential pair, wherein the grounding circuitry is configured to receive the current pulse; and
a bias device that is coupled to the differential pair and the grounding circuitry and is configured to adjust an amount of current flowing through the differential pair;
wherein the current pulse circuitry comprises:
a first current transistor and a second current transistor coupled in series with each other, the first current transistor and second current transistor being coupled between a first voltage source and the grounding circuitry at a grounding node, a gate of the first current transistor and a gate of the second current transistor coupled to a first input terminal; and
a third current transistor and a fourth current transistor coupled in series between the first voltage source and the grounding circuitry at the grounding node, a gate of the third current transistor and a gate of the fourth current transistor coupled to a second input terminal.

2. The system, as set forth in claim 1, comprising a plurality of output terminals coupled to the differential pair and adjustment circuitry, wherein the plurality of output terminals are configured to provide the plurality of output signals.

3. The system, as set forth in claim 1, wherein the grounding circuitry is configured to receive the current pulse to prevent the plurality of output signals from switching during a transition.

4. The system, as set forth in claim 1, wherein the first and second current transistors are coupled in parallel with the third and fourth current transistors between the first voltage source and the grounding node.

5. The system, as set forth in claim 1, wherein the device comprises a dynamic random access memory.

6. The system, as set forth in claim 1, wherein the device comprises a static random access memory.

7. The system, as set forth in claim 1, wherein the device comprises an application specific integrated circuit.

8. The system, as set forth in claim 1, comprising a display coupled to the processor.

9. A differential buffer comprising:
a first stage comprising:
a differential pair configured to receive a first input signal and second input signal and to generate a first output signal and a second output signal based on the first and second input signals; and
a second stage comprising:
current pulse circuitry coupled to the differential pair, wherein the current pulse circuitry is configured to generate a current pulse when the differential pair switches the output signals; and
grounding circuitry coupled to the current pulse circuitry and the differential pair, wherein the grounding circuitry is configured to receive the current pulse to prevent the output signals from switching during a transition of the first output signal and the second output signal;
wherein the first stage further comprises a bias device that is coupled to the differential pair and the grounding circuitry and is configured to adjust an amount of current flowing through the differential pair, the bias device comprising a first dissipation transistor and a second dissipation transistor coupled in series, wherein the first dissipation transistor is coupled to each of the differential pair, the grounding circuitry, and a gate of the second dissipation transistor, and wherein a gate of the first dissipation transistor is coupled to a first voltage source, and the second dissipation transistor is coupled to a second voltage source.

10. The differential buffer, as set forth in claim 9, wherein the first stage comprises adjustment circuitry coupled to the differential pair and configured to adjust an amount of current dissipated by the differential buffer.

11. The differential buffer, as set forth in claim 9, wherein the first stage comprises:
a first input terminal coupled to each of a gate of a first transistor, a gate of a second transistor, the current pulse circuitry and the grounding circuitry,
wherein the first transistor is coupled in series between the first dissipation transistor and the grounding circuitry at a first node and the second transistor and a first adjustment transistor that are coupled in parallel to the first voltage source at a second node, and wherein the gate of the first adjustment transistor is coupled to the second voltage source;
a second input terminal coupled to a gate of a third transistor, a gate of a fourth transistor, the current pulse circuitry and the grounding circuitry,
wherein the third transistor is coupled in series between the first dissipation transistor and the grounding circuitry at the first node and the fourth transistor and a second adjustment transistor that are coupled in parallel to the first voltage source at a third node, and wherein the gate of the second adjustment transistor being coupled to the second voltage source; and
a first output terminal coupled to the second node; and
a second output terminal coupled to the third node.

12. The differential buffer, as set forth in claim 9, wherein the first stage comprises a first input terminal and a second input terminal coupled to each of the differential pair and the bias device; and
wherein the current pulse circuitry of the second stage comprises:

a first current transistor and a second current transistor coupled in series with each other, the first current transistor and second current transistor being coupled between the first voltage source and the grounding circuitry at a grounding node, a gate of the first current transistor and a gate of the second current transistor coupled to the second input terminal;

a third current transistor and a fourth current transistor coupled in series between the first voltage source and the grounding circuitry at the grounding node, a gate of the third current transistor and a gate of the fourth current transistor coupled to the first input terminal.

13. The differential buffer, as set forth in claim 9, wherein the first and second input signals are complimentary signals.

14. The differential buffer, as set forth in claim 9, wherein the first and second output signals are complimentary signals.

15. A differential buffer comprising:
a first stage comprising:
  a differential pair configured to receive a first input signal and second input signal and to generate a first output signal and a second output signal based on the first and second input signals; and
a second stage comprising:
  current pulse circuitry coupled to the differential pair, wherein the current pulse circuitry is configured to generate a current pulse when the differential pair switches the output signals; and
  grounding circuitry coupled to the current pulse circuitry and the differential pair, wherein the grounding circuitry is configured to receive the current pulse to prevent the output signals from switching during a transition of the first output signal and the second output signal;

wherein the first stage further comprises:
  a bias device that is coupled to the differential pair and the grounding circuitry and is configured to adjust an amount of current flowing through the differential pair; and
  a first input terminal and a second input terminal coupled to each of the differential pair and the bias device; and wherein the current pulse circuitry of the second stage comprises:
  a first current transistor and a second current transistor coupled in series with each other, the first current transistor and second current transistor being coupled between a first voltage source and the grounding circuitry at a grounding node, a gate of the first current transistor and a gate of the second current transistor coupled to the second input terminal; and
  a third current transistor and a fourth current transistor coupled in series between the first voltage source and the grounding circuitry at the grounding node, a gate of the third current transistor and a gate of the fourth current transistor coupled to the first input terminal.

* * * * *